US012105691B1

(12) United States Patent
Hudson et al.

(10) Patent No.: US 12,105,691 B1
(45) Date of Patent: Oct. 1, 2024

(54) DISTRIBUTABLE HASH FILTER FOR NONPROBABILISTIC SET INCLUSION

(71) Applicant: Hewlett Packard Enterprise Development LP, Spring, TX (US)

(72) Inventors: Ashton Hudson, Cape Town (ZA); Pierre Hugo, Cape Town (ZA); Charl Cater, Cape Town (ZA); Leonard Botha, Johannesburg (ZA)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 18/461,128

(22) Filed: Sep. 5, 2023

(51) Int. Cl.
*G06F 16/22* (2019.01)
*H03M 7/30* (2006.01)

(52) U.S. Cl.
CPC ........ *G06F 16/2255* (2019.01); *H03M 7/702* (2013.01)

(58) Field of Classification Search
CPC ........................... G06F 16/2255; H03M 7/702
USPC ........................................................ 707/758
See application file for complete search history.

(56) References Cited

U.S. PATENT DOCUMENTS

| | | | |
|---|---|---|---|
| 9,647,875 B1* | 5/2017 | Lambert | H04L 41/12 |
| 9,928,178 B1* | 3/2018 | Solapurkar | H04L 67/568 |
| 10,554,405 B1* | 2/2020 | Endress | H04L 9/30 |
| 10,790,984 B1* | 9/2020 | Stiles | G06F 21/31 |
| 2010/0228701 A1* | 9/2010 | Harris, III | H04L 51/212 |
| | | | 711/216 |

* cited by examiner

*Primary Examiner* — Hicham Skhoun
(74) *Attorney, Agent, or Firm* — Slater Matsil, LLP

(57) ABSTRACT

In certain embodiments, a method includes recursively performing a procedure that includes using an allowed set of object identifiers and a hash function to update a bit array, using a disallowed set of object identifiers and the hash function to further update the bit array where collisions occur, repeating the process with a new allowed set that includes object identifiers from the original allowed set that collided with the disallowed set and a new hash function, until reaching a round where no collisions occurred, generating a data structure that includes the bit arrays created during each recursive round, and compressing the data structure.

20 Claims, 5 Drawing Sheets

DISTRIBUTABLE HASH FILTER FOR NONPROBABILISTIC SET INCLUSION

BACKGROUND

Membership of an identifier in a set may be performed from time to time. As an example, identifiers of devices may be a set, and a given user may have access to only some of the devices. Therefore, to determine if the user may access a device, membership of the device to which access is sought by the user may be tested. However, techniques for testing membership in a set may require larger amounts of resources to check an identifier of the device to which access is sought against a large set of device identifiers. Other techniques may be able to probabilistically determine whether it is likely or not that the device identifier is in a set, but may be unable to non-probabilistically provide a definite answer.

BRIEF DESCRIPTION OF THE DRAWINGS

Certain embodiments discussed herein will be described with reference to the accompanying drawings listed below. However, the accompanying drawings illustrate only certain aspects or implementations of embodiments described herein by way of example, and are not meant to limit the scope of the claims.

DETAILED DESCRIPTION OF ILLUSTRATIVE EMBODIMENTS

Figure 1:
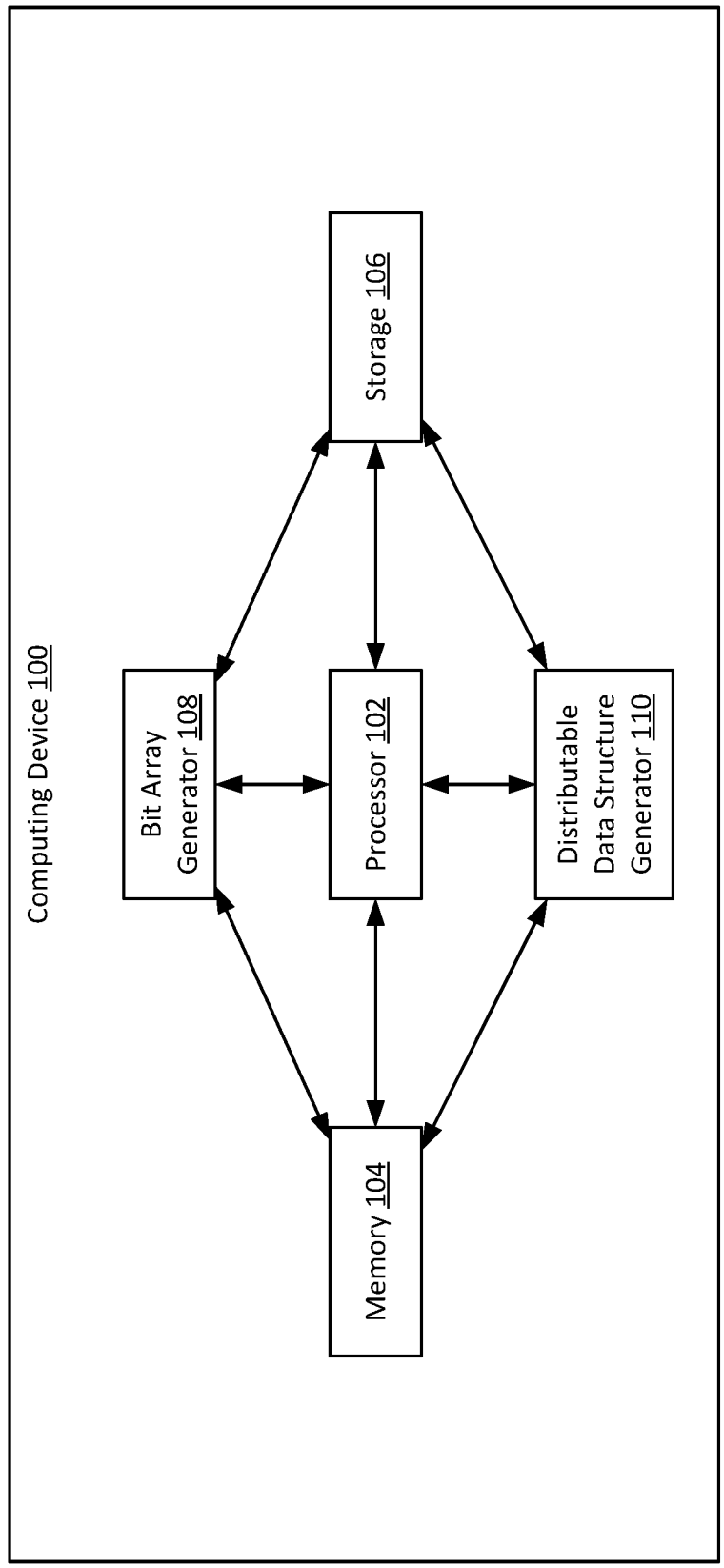
FIG. 1 illustrates a block diagram of an example system for implementing a generating a distributable hash filter for non-probabilistically determining set inclusion in accordance with or more embodiments of this disclosure.

Scenarios may exist in which a particular user in an ecosystem of devices is only permitted access to a subset of the devices, to obtain information only about a subset of the devices, etc. As an example, a network may include any number of network devices. In such a network, there may be any number of users (e.g., network administrators). Each of the users may be responsible for only a portion of the network and the subset of network devices in that portion (e.g., the network devices of a subset of stores of a large chain of stores).

To limit access of a particular user to only a subset of devices, a list of the devices that the user is allowed to access may be obtained (e.g., an allowed set of devices). When the user requests information about one or more devices, a determination may be made as to whether the user is allowed to obtain such information. To make such a determination, the allowed set may be reviewed to determine if the allowed set includes the one or more devices for which information is being requested. However, when the set of devices becomes large (e.g., hundreds, thousands, millions, etc. of devices), merely checking the allowed set may be expensive in terms of time and/or resources to determine if the request may be satisfied, as a set of unique identifiers of the devices may be large, not easily compressible, and therefore not easily distributable. Other techniques may be used to determine if the one or more devices are in the allowed set, such as Bloom filters, XOR filters, Cuckoo filters, etc. However, these data structures are probabilistic in nature, and therefore cannot always provide definitive answers. Additionally, techniques such as those discussed above may rely on the provision of large data structures to be accessed each time a user requests information about one or more devices. Such large data structures may be difficult to efficiently share or access in real time as a user makes requests related to devices.

To potentially address some or all the aforementioned problems with determining whether a particular user may access or obtain information about one or more devices, certain embodiments of this disclosure provide techniques for creating, distributing, and using a compact, distributable, and search-optimized way to encode and distribute large sets of objects (e.g., devices) to various services (e.g., microservices) in a device ecosystem. The services may use the data structure to test allowed set membership of an identifier of an object. In one or more embodiments, the structure is agnostic to the type of objects it encodes or the identifiers used in its creation, such as strings or universally unique identifiers (UUIDs). Unlike existing filters used for membership testing, such as the aforementioned Bloom, XOR or Cuckoo filters, the data structure disclosed herein may be used to deterministically (i.e. non-probabilistically) determine membership or non-membership of an object (e.g., a device), and may be compressed to sizes similar to or smaller than known probabilistic filters, which may, for example, allow the data structure to fit into hypertext transfer protocol (HTTP) headers used when a user makes a request relating to an object (e.g., a device).

In one or more embodiments, to create the data structure an allowed set for a particular user is obtained. As discussed above, an allowed set may be a set of object identifiers, such as device identifiers, identifying objects (e.g., devices) that the user has permission to access and/or request related information about. As an example, an allowed set may be a set of UUIDs of devices in a network that a particular user is allowed to access and/or obtain information related to. In one or more embodiments, the total set of objects is also obtained (e.g., a total set of identifiers of all devices in a network). In one or more embodiments, the allowed set is removed from the total set to obtain a disallowed set (e.g., of device identifiers).

In one or more embodiments, once the allowed set and the disallowed set are obtained, a bit array may be created. The bit array may initially be populated with all zeros. The size of the bit array may be predetermined based on how quickly the creation of the final data structure is desired. In one or more embodiments, a larger array may result in less recursive rounds of the technique described below, but use more memory resources to store the larger array as the technique is performed. Conversely, a smaller bit array may use less memory resources, but may also use more recursive rounds of the technique.

In one or more embodiments, each identifier in the allowed set is used as input to a first hash function to obtain an integer output. The integer output is used as an index value identifying a location in the bit array. The hash function may be selected, at least in part, based on being able to output index values that identify or otherwise correspond to locations in the bit array. Each position corresponding to an index value obtained using an identifier from the allowed set and the first hash function is set from zero to one. In the event that two or more identifiers from the allowed set result in the same index value output from the hash function, the value at the index position is kept at one.

In one or more embodiments, once all the identifiers in the allowed set have been used as input to the hash function, and the corresponding index positions have been set to one, the disallowed set is then obtained. Each identifier in the disallowed set is used as input to the first hash function. In one or more embodiments, when the output from the hash function corresponding to an identifier in the disallowed set is an index value of the bit array that is already zero, the bit is kept at zero. In one or more embodiments, when the output from the hash function corresponding to an identifier in the disallowed set is an index value identifying a position in the bit array that is already set to one, each identifier in the allowed set that also corresponds to the index position is added to a new allowed set, and that index position is reset to zero.

Thus, in one or more embodiments, after all identifiers in the disallowed set have been assessed, the new allowed set includes all identifiers from the previous allowed set that had a collision in the bit array with at least one identifier from the disallowed set, and the bit array includes one at all positions where the allowed set and disallowed set did not collide, and zeros at all positions where a collision occurred or to which no allowed set identifier corresponded. Thus, in one or more embodiments, the first bit array is a sparse array, having many zeros and some number of ones representing a subset of the identifiers in the allowed set.

In one or more embodiments, another round is performed as described above. Specifically, another bit array is obtained that includes all zeros, the identifiers from the new allowed set (which includes a subset of the identifiers from the initial allowed set) obtained in the previous round are input to a new hash function, and the bits corresponding to the output index positions from the new hash function are set to one. In one or more embodiments, the full disallowed set of identifiers is again used as input to the new hash function, with collisions in the bit array again resulting in the corresponding index position in the bit array being reset to zero, and the one or more allowed set identifiers corresponding to the collision position are added to a third allowed set. In one or more embodiments, after this second round, the third allowed set is obtained, along with a second sparse bit array.

In one or more embodiments, additional rounds of the above described process are performed recursively until reaching a round in which there are no collisions between the full disallowed set and the new, smaller allowed set.

In one or more embodiments, the set of sparse bit arrays generated using the above described process may be used to create a data structure that includes the sparse bit arrays. The data structure may then be compressed using lossless compression techniques, resulting in a space-efficient compressed data structure. The compressed data structure may then be distributed to one or more entities that may determine if a given object identifier was in the initial allowed set.

As an example, the data structure may be created for a particular user in a network, and the identifiers in the allowed set may be UUIDs of devices for which the user has permission to access or obtain related information. In one or more embodiments, because the compressed data structure is much smaller than, for example, the list of identifiers in the allowed set, the data structure may be included when the user makes a request (e.g., to one or more services in of a micro-service architecture) to access a device or for information related thereto to determine whether the user has appropriate permissions for the request to be serviced.

The service may use the data structure received as part of the request to determine if the user has appropriate permissions without having to access any other service to make the determination as to whether the request may be serviced. As an example, a user may send a request for average page load time for a set of devices, identified in the request by their UUIDs. In one or more embodiments, the entity that receives the request also receives the data structure, and thus may use the UUIDs of the devices in the request to test whether each device is in the allowed set for the user.

In one or more embodiments, to use the data structure, the entity (e.g., a micro-service) may decompress the data structure to obtain the set of sparse bit arrays. The entity may then take a UUID of a device, and use it as input to each of the hash functions corresponding to the bit arrays. The output of the hash function may be used as an index value to lookup a position in the corresponding bit array. In one or more embodiments, if a one is present at the position, then the UUID is in the allowed set for the user. In one or more embodiments, if all the bit arrays are checked in the aforementioned manner, and none result in finding a one, then the UUID was in the disallowed set (or at least not in the allowed set), meaning that the user is not allowed to access information related to a device corresponding to the UUID.

Certain embodiments of this disclosure may improve the ability of an entity to test whether an identifier (e.g., of a device) is in an allowed set by providing a compact, data structure compressed via lossless compression that may be distributed and used when requests are made to allow the entity to decompress the data structure, and use identifiers included in the request, and the hash functions associated with the bit arrays of the decompressed data structure to test membership in the allowed set using the bit arrays of the decompressed data structure.

FIG. 1 illustrates a block diagram of an example system for implementing a generating a distributable hash filter for non-probabilistically determining set inclusion in accordance with or more embodiments of this disclosure. As shown in FIG. 1, the system includes a computing device 100. The computing device 100 may include a processor 102, a memory 104, a storage 106, a bit array generator 108, and a distributable data structure generator 110. Each of these components is described below.

In one or more embodiments, as used herein, the computing device 100 may be any single computing device, a set of computing devices, a portion of one or more computing devices, or any other physical, virtual, and/or logical grouping of computing resources. In one or more embodiments, the computing device 100 is any device, portion of a device, or any set of devices capable of electronically processing instructions and may include, but is not limited to, any of the following: one or more processors (e.g. components that include circuitry), memory (e.g., random access memory (RAM)), input and output device(s), non-volatile storage hardware (e.g., solid-state drives (SSDs), hard disk drives (HDDs) (not shown)), one or more physical interfaces (e.g., network ports, storage ports), any number of other hardware components (not shown), and/or any combination thereof.

Examples of computing devices include, but are not limited to, a server (e.g., a blade-server in a blade-server chassis, a rack server in a rack, etc.), a desktop computer, a mobile device (e.g., laptop computer, smart phone, personal digital assistant, tablet computer, automobile computing system, and/or any other mobile computing device), a storage device (e.g., a disk drive array, a fibre channel storage device, an Internet Small Computer Systems Interface (ISCSI) storage device, a tape storage device, a flash storage array, a network attached storage device, etc.), a network device (e.g., switch, router, multi-layer switch, etc.), a virtual machine, a virtualized computing environment, a logical container (e.g., for one or more applications), an Internet of Things (IoT) device, an array of nodes of computing resources, a supercomputing device, a data center or any portion thereof, and/or any other type of computing device with the aforementioned requirements. In one or more embodiments, any or all the aforementioned examples may be combined to create a system of such devices, or may be partitioned into separate logical devices, which may collectively be referred to as a computing device. Other types of computing devices may be used without departing from the scope of embodiments described herein, such as, for example, the computing device shown in FIG. 5 and described below.

In one or more embodiments, the storage (e.g., the storage 106) and/or memory (e.g., the memory 104) of a computing device or system of computing devices may be and/or include one or more data repositories for storing any number of data structures storing any amount of data (e.g., information). In one or more embodiments, a data repository is any type of storage unit and/or device (e.g., a file system, database, collection of tables, RAM, and/or any other storage mechanism or medium) for storing data. Further, the data repository may include multiple different storage units and/or devices. The multiple different storage units and/or devices may or may not be of the same type or located at the same physical location.

In one or more embodiments, any storage and/or memory of a computing device or system of computing devices may be considered, in whole or in part, as non-transitory computer readable mediums storing software and/or firmware.

Such software and/or firmware may include instructions which, when executed by the one or more processors (not shown) and/or other hardware (e.g., circuitry) of a computing device and/or system of computing devices, cause the one or more processors and/or other hardware components to perform operations in accordance with one or more embodiments described herein.

The software instructions may be in the form of computer readable program code to perform methods, processes, etc. of embodiments as described herein, and may, as an example, be stored, in whole or in part, temporarily or permanently, on a non-transitory computer readable medium such as a compact disc (CD), digital versatile disc (DVD), storage device, diskette, tape storage, flash storage, physical memory, or any other non-transitory computer readable medium.

Although FIG. 1 shows one computing device 100, the system may include any number of computing devices, any number of which may be collectively considered a computing device as used herein. All or any portion of the computing devices may be the same type or be different types of computing devices.

In one or more embodiments, the computing device 100 includes a processor 102. In one or more embodiments, the processor 102 is any component that includes circuitry and/or other hardware for executing instructions (e.g., of a computer program).

As an example, such circuitry may be integrated circuitry implemented, at least in part, using transistors implementing components such as arithmetic logic units, control units, registers, data buffers, control buffers, etc. In one or more embodiments, the processor 102 may include any number of additional components (e.g., cache memory). In one or more embodiments, the processor 102 is configured to retrieve and/or decode instructions, which may then be executed. Execution of instructions may include operating on data, which may include reading and/or writing data. In one or more embodiments, instructions and/or data used by a processor are stored, at least temporarily, in memory of the computing device 100 (e.g., the processor memory 104). The processor 102 may perform various operations for executing software, such as operating systems, applications, etc. The processor 102 may cause data to be written from memory to storage of the computing device 100 and/or cause data to be read from storage via memory of the computing device 100. The processor 102, may, for example, be a CPU, and may have any number of processing cores. Although FIG. 1 shows the computing device 100 as having a single processor 102, the computing device 100 may include any number of processors without departing from the scope of embodiments disclosed herein.

In one or more embodiments, the computing device 100 includes the memory 104. The processor memory 104 may be operatively connected to the processor 102. In one or more embodiments, the memory 104 is any one or more memory devices. In one or more embodiments, a memory device is any type of computer memory. In one or more embodiments, a memory device includes a volatile storage device. As an example, a memory device may include RAM. In one or more embodiments, data stored in a memory device is located at any number of memory addresses, and is thus accessible to the processor 102 using the memory addresses. The processor 102 may write data to and/or read data from the processor memory 104. Although FIG. 1 shows a single processor memory 104, the computing device 100 may include any amount of processor memory without departing from the scope of embodiments disclosed herein.

In one or more embodiments, the computing device 100 includes the storage 106. In one or more embodiments, the storage 106 is any type of computer storage (discussed above) configured to store any one or more types of data structures that include information of any type. As an example, the storage 106 may be configured to store bit arrays, object sets, compressed data structures, etc.

In one or more embodiments, the computing device 100 includes the bit array generator 108. In one or more embodiments, the bit array generator 108 is any hardware, software, firmware, or any combination thereof that is configured to generate a bit array. The bit array generator may be configured to generate bit arrays of any size. The size of the bit array may be predetermined based on how quickly the creation of the final data structure is desired. In one or more embodiments, a larger array may result in less recursive rounds of the technique described herein, but use more memory resources to store the larger array as the technique is performed. Conversely, a smaller bit array may use less memory resources, but may also use more recursive rounds of the technique. In one or more embodiments, the bit array generator 108 may be configured to generate bit arrays which are initially populated with zeros. In one or more embodiments, each position in a bit array generated by the bit array generator 108 may be referred to as an index position within the bit array. As an example, a bit array may be generated that includes all zeros at ten positions, which correspond to index positions zero through nine. In one or more embodiments, the bit array generator 108 is operatively connected to the processor 102, the storage 106, and the memory 104. A bit array generated by the bit array generator may be generated, at least in part, using the processor 102, and may be stored in the storage 106 and/or the memory 104 for performing the techniques disclosed herein.

In one or more embodiments, the computing device 100 includes the distributable data structure generator 110. In one or more embodiments, the distributable data structure generator 110 is any hardware, software, firmware, or any combination thereof that is configured to generate a distributable data structure that may be used to test inclusion of an object in a set. In one or more embodiments, the distributable data structure generator 110 is operatively connected to the processor 102, the memory 104, and the storage 106. The distributable data structure generator 110 may execute using the processor 102, and may obtain data from and store data to the storage 106 and/or the memory 104.

In one or more embodiments, the distributable data structure generator 110 is configured to obtain an allowed set of objects (e.g., devices identified by device identifiers) and a total set of objects of which the allowed set is a subset. In one or more embodiments, the distributable data structure generator 110 is configured to obtain a disallowed set of objects using the allowed set and the total set. As an example, the disallowed set may be all objects in the total set other than those in the allowed set. For example, a total set may be a set of all UUIDs of devices in a device ecosystem, an allowed set may be a set of UUIDs of devices that a particular user is allowed to access, or about which the user is allowed to obtain information, and the disallowed set may be the set of other devices in a device ecosystem for which the particular user does not have such permissions.

In one or more embodiments, the distributable data structure generator 110 is configured to execute any number of hash functions. In one or more embodiments, the distributable data structure generator 110 executes a hash function using an object identifier as input to obtain an output. In one or more embodiments, the output of the hash function is a value that corresponds to an index position of a bit array generated by the bit array generator 108. In one or more embodiments, the hash functions used by the distributable data structure generator 110 may be selected based on providing an output that is within a range of index positions of the bit array. As an example, if the bit array has one hundred index positions, a hash function may be selected that generates an output integer of zero to ninety-nine.

In one or more embodiments, the distributable data structure generator 110 is configured to update the bit array by setting to one each index position generated as an output of the hash function when an object identifier from the allowed set is used as an input. In the event that more than one object identifier from the allowed set leads to a hash function output that corresponds to the same index position, the distributable data structure generator 110 may keep the value at that index position set to one. In one or more embodiments, once all object identifiers in the allowed set have been used as input to the hash function, and the corresponding bits in the bit array set to one, the result is a sparse bit array that has ones at the index positions generated using the hash functions and the object identifiers of the allowed set.

In one or more embodiments, the distributable data structure generator 110 is configured to use the same hash function, and the object identifiers of the disallowed set, to update the sparse bit array. In one or more embodiments, when an object identifier from the disallowed set used as input to the hash function results in an output of an index position in the sparse bit array that is already zero, the index position is kept at zero. In one or more embodiments, when an object identifier from the disallowed set used as input to the hash function results in an output of an index position in the sparse bit array that was previously set to one (based on one or more allowed set object identifiers), the bit at that index position is reset to zero, and each identifier from the allowed set that corresponded to the index position is added to a new allowed set. In one or more embodiments, the result of the technique described above includes a new allowed set that is a subset of the initial allowed set, and includes objects for which a collision with at least one object of the disallowed set occurred. The result also includes a sparse bit array that includes zeros at all index positions that did not correspond to an identifier from the allowed set, or at which a collision between the disallowed set and the allowed set occurred, and ones at all index positions that corresponded to one or more identifiers of the allowed set but did not have a collision with the disallowed set.

In one or more embodiments, the above described technique executed by the distributable data structure generator 110 may be considered a first round of a set of recursive rounds of generating a data structure that includes a set of sparse bit arrays, each generated after a round of performance of the techniques disclosed herein. For the next round, the bit array generator 108 generates a new bit array that includes all zeros. In one or more embodiments, the distributable data structure generator 110 is configured to use the new allowed set generated during the previous round and a new hash function to update the bit array with ones at index positions corresponding to outputs of the new hash function when the identifiers from the new allowed set are used as input. In one or more embodiments, the distributable data structure generator 110 is configured to again use the entire disallowed set and the new hash function to either keep index positions in the updated bit array at zero, or to reset the index positions to zero when a disallowed set identifier and the new hash function result in a collision with an index position previously set to one based on one or more identifiers from the allowed set. In one or more embodiments, each allowed set identifier corresponding to an index position is added to another new allowed set, and a new updated sparse bit array is obtained.

In one or more embodiments, any number of rounds may be performed, until a round is reached in which no collisions with the identifiers from the disallowed set occur, at which point the distributable data structure generator 110 may stop performing additional rounds of the technique. Each new round may use a hash function that is different from that used in previous rounds. The final result may be a set of sparse bit arrays. In one or more embodiments, the distributable data structure generator 110 is configured to use the set of sparse bit arrays to generate the data structure, and then to compress the data structure. In one or more embodiments, the data structure of sparse bit arrays is compressed using an lossless compression technique. In one or more embodiments, due to the data structure including mostly zeros and some number of ones, the lossless compression results in a highly compressed data structure. As such, in one or more embodiments, the compressed data structure may be distributed to one or more entities (e.g., various services within and/or corresponding to a device ecosystem) that may test whether one or more object identifiers are in the allowed set. As an example, the compressed data structure may correspond to an allowed set of device identifiers for which a particular user in a device ecosystem has permissions, and the compressed data structure may be small enough to include in a header (e.g., a HTTP header) of a request made by the user to access information related to one or more devices in the device ecosystem. In such an example, the service that received the request may decompress the data structure, and use the device identifiers included in the request, along with the hash functions used to generate the data structure, to determine whether the one or more device identifiers in the request are in the allowed set corresponding to the user. The creation of the data structure is discussed further in the description of FIG. 2, below. The use of the compressed data structure for testing set membership is discussed further in the description of FIG. 3, below.

While FIG. 1 shows a particular configuration of components, other configurations may be used without departing from the scope of embodiments described herein. For example, although FIG. 1 shows certain components as part of the same device, any of the components may be grouped in sets of one or more components which may exist and execute as part of any number of separate and operatively connected devices. As another example, a single component may be configured to perform all, or any portion of the functionality performed by the components shown in FIG. 1. Accordingly, embodiments disclosed herein should not be limited to the configuration of components shown in FIG. 1.

Figure 2:
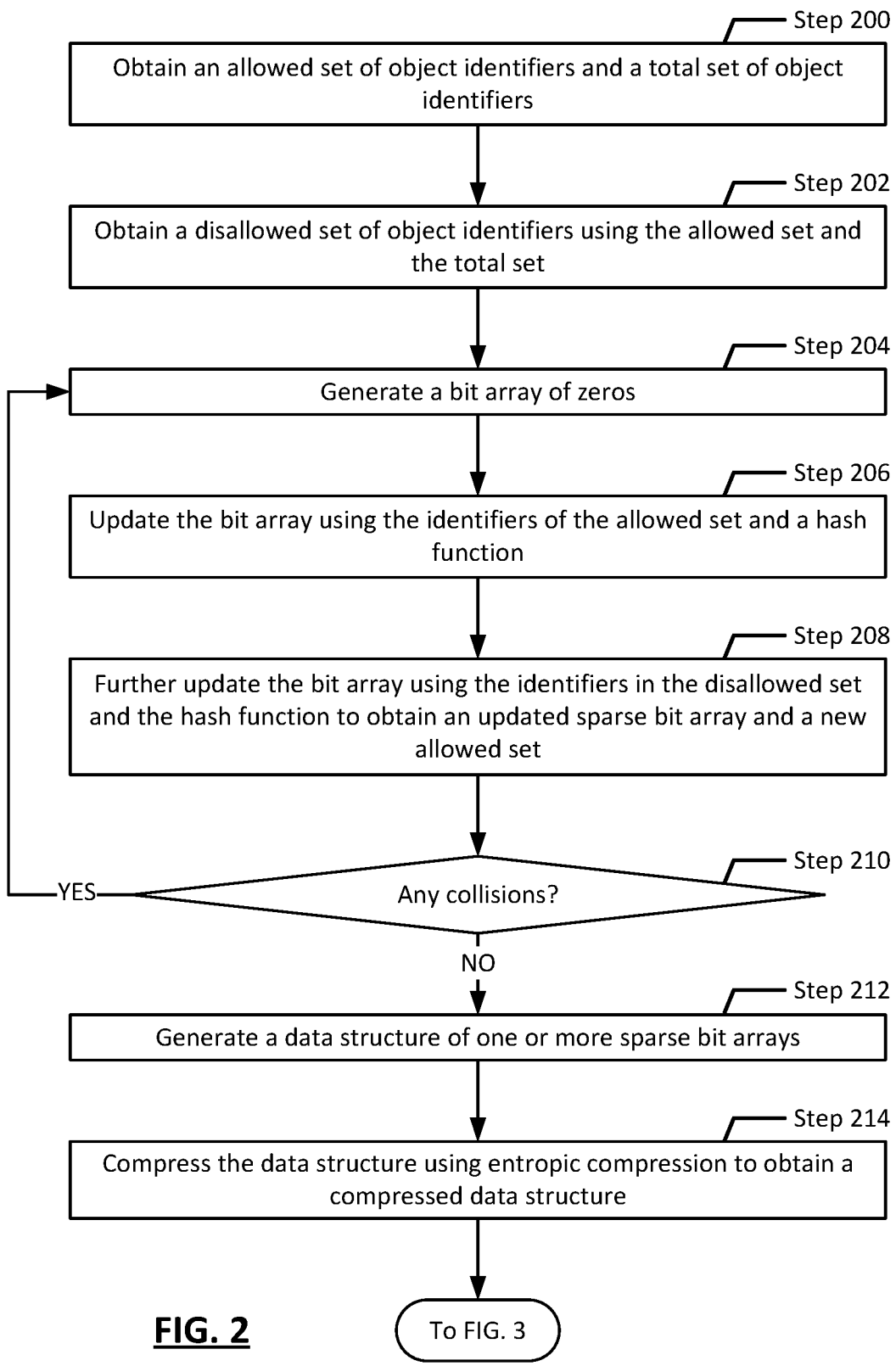
FIG. 2 illustrates an overview of an example method for generating a compressed data structure of sparse bit arrays for testing membership of an object identifier in an allowed set of object identifiers in accordance with one or more embodiments disclosed herein.

FIG. 2 illustrates an overview of an example method for generating a compressed data structure of sparse bit arrays for testing membership of an object identifier in an allowed set of object identifiers in accordance with one or more embodiments disclosed herein. The method may be performed, for example, by a computing device (e.g., the computing device 100 of FIG. 1, the computing device 500 of FIG. 5), and/or by any one or more components therein (e.g., the processor 102, the memory 104, the storage 106, the bit array generator 108, and/or the distributable data structure generator 110 shown in FIG. 1).

Figure 3:
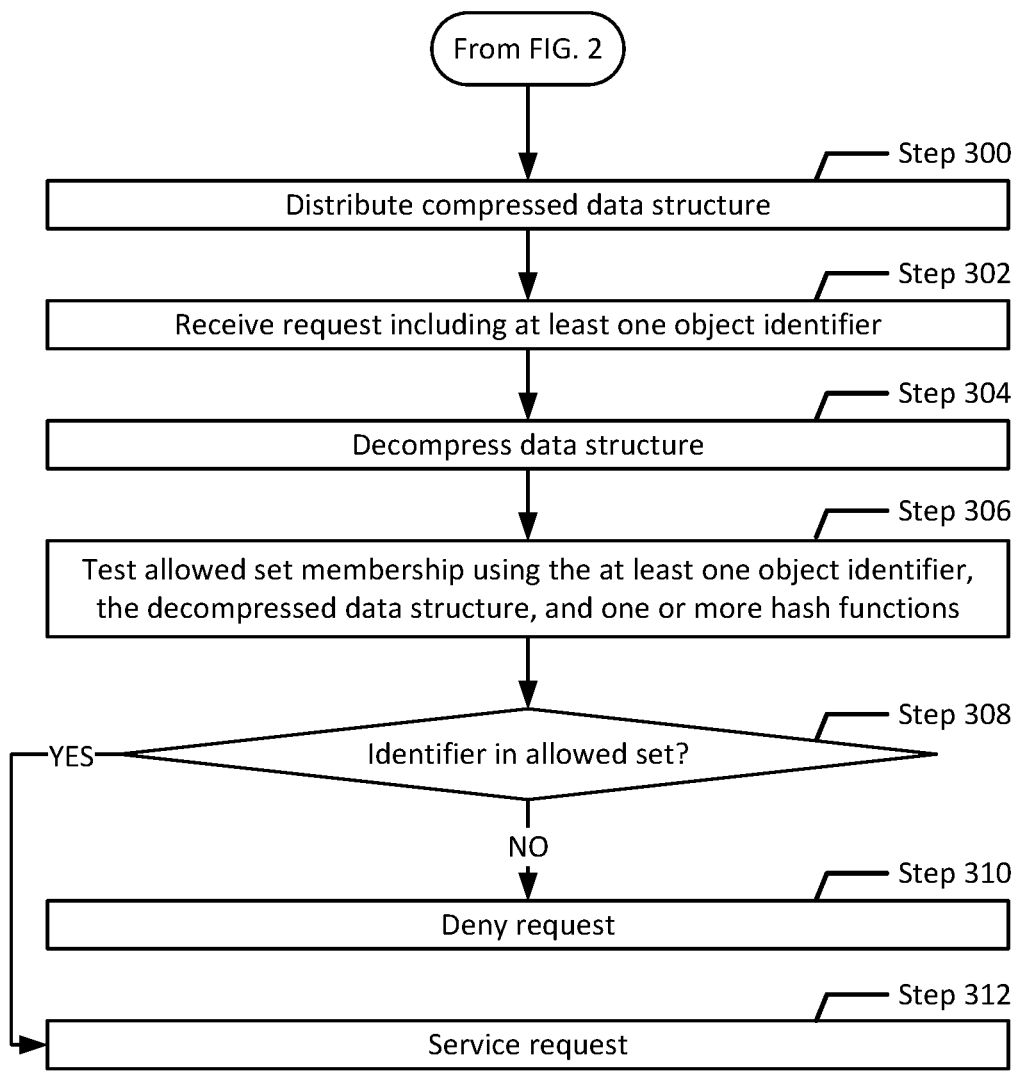
FIG. 3 illustrates an overview of an example method for using a compressed data structure of sparse bit arrays for testing membership of an object identifier in an allowed set of object identifiers in accordance with one or more embodiments disclosed herein.

While the various steps in the flowchart shown in FIG. 2 are presented and described sequentially, some or all of the steps may be executed in different orders, some or all of the steps may be combined or omitted, and/or that or all of the steps may be executed in parallel with other steps of FIG. 2 and/or FIG. 3.

In Step 200, the method includes obtaining an allowed set of object identifiers and a total set of object identifiers. The allowed set of object identifiers may include any number of object identifiers, and may correspond to a set of objects for which an entity has permissions of any sort. As an example, the entity may be a user, such as a network administrator, in a device ecosystem, and the allowed set may include a set of UUIDs as device identifiers corresponding to devices of the device ecosystem that the user is allowed to access and/or about which the user may obtain information. In one or more embodiments, the total set of object identifiers includes the object identifiers of the allowed set, as well as all other object identifiers in the set of objects. As an example, the total set may include all UUIDs for devices in a device ecosystem. The allowed set and the total set may be obtained using any technique for obtaining information. As an example, a provider of devices in a device ecosystem may maintain the total set of device identifiers in the device ecosystem, and an entity that controls, owns, uses, etc. the devices of the device ecosystem may provide a list of users, each having a corresponding allowed set of device identifiers. In one or more embodiments, rather than an allowed set corresponding to a user, an additional layer of abstraction may be provided, and the allowed set may be derived using the additional layer of abstraction. As an example, the device ecosystem may be a set of network devices deployed at a number of stores of a restaurant chain, and each user may be associated with a subset of the stores. Thus, the associations between a user and one or more stores may be used to determine the set of devices in those stores, the identifiers of which are the allowed set for the user.

In Step 202, the method includes obtaining a disallowed set of object identifiers using the allowed set and the total set obtained in Step 200. As an example, the object identifiers of an allowed set may be removed from the total set, and the remaining object identifiers may be the disallowed set.

In Step 204, the method includes generating a bit array that initially includes zeros at each position in the bit array. The bit array may be generated, for example, by the bit array generator 108 shown in FIG. 1 and described above. The bit array may be of any size. The size of the bit array may be configurable. In one or more embodiments, the size of the bit array may be determined based on how quickly the creation of the final data structure is desired. In one or more embodiments, a larger array may result in less recursive rounds of the method shown in FIG. 2, but use more memory resources to store the larger array as the method is performed. Conversely, a smaller bit array may use less memory resources, but may also use more recursive rounds of the method.

In Step 206, the method includes updating the bit array using the object identifiers of the allowed set and a hash function. In one or more embodiments, each object identifier in the allowed set is used as an input to the hash function. In one or more embodiments, the output of the hash function is a value (e.g., an integer value) that corresponds to a position in the bit array generated in Step 204. In one or more embodiments, the set of hash functions used in the method shown in FIG. 2 may be selected based on the ability to output values that correspond to the positions in the bit array. The output of the hash function may be referred to as an index, and the corresponding positions in the bit array may be referred to as index positions in the bit array. In one or more embodiments, each index position output from the hash function based on an input of an object identifier from the allowed set is set to one, while the other index positions remain at zero. In one or more embodiments, in the event that more than one object identifier from the allowed set results in the index position output from the hash function, the value at the index position is kept at one. After using each object identifier in the allowed set as input to the hash function, and setting or keeping the corresponding index positions to one, the result is an updated bit array that includes ones at each index position corresponding to one or more object identifiers in the allowed set, and zeros at the other positions in the bit array.

In Step 208, the method includes further updating the bit array using the object identifiers in the disallowed set and the hash function to obtain an updated sparse bit array and a new allowed set. In one or more embodiments, each object identifier in the disallowed set is used as an input to the hash function. In one or more embodiments, the output of the hash function is an index position in the bit array. In one or more embodiments, when value the index position output by the hash function based on an input of a given object identifier from the disallowed set is a zero, the value is kept at zero. In one or more embodiments, when the value at the index position output by the hash function based on an input of a given object identifier from the disallowed set is a one, the bit is changed back to zero, as there was a collision (e.g., a hash collision) between the object identifier from the disallowed set and one or more object identifiers from the allowed set. In one or more embodiments, when such a collision occurs, each of the one or more object identifiers from the allowed set that correspond to the index position at which the collision occurred are added to a new allowed set. Accordingly, in one or more embodiments, the new allowed set object identifiers are a subset of the object identifiers of the initial allowed set, or of the object identifiers of the previous allowed set after each round of Steps 204-208 are performed.

In Step 210, the method includes making a determination as to whether any has collisions occurred during the current round of analysis. In one or more embodiments, in Step 208, as discussed above, a collision occurs each time an object identifier from the full disallowed set is used as input to the hash function being used for the current round of analysis results in an index position previously set to one based on one or more object identifiers from the allowed set and the hash function. If one or more such collisions occurred, the method returns to Step 204. In one or more embodiments, if no such collisions occurred, then the method proceeds to Step 212.

In one or more embodiments, Steps 204-208 are repeated for as many rounds as necessary reach a determination in Step 210 that no collisions occurred in the present round. In one or more embodiments, for each such round, the new allowed set generated in the last round as described above is used as the allowed set for Step 206, and the full disallowed set is used for Step 208. In one or more embodiments, each round uses a hash function that is different from the hash function used in previous rounds. The size of the bit array generated in Step 204 may be the same for each round, or may differ from round to round.

In Step 212, the method includes generating a data structure of one or more sparse bit arrays. In one or more embodiments, the number of sparse bit arrays in the data structure is the number of rounds of Steps 204-208 that are performed before a determination is made in Step 210 that no collision occurred. The data structure of sparse bit arrays may be a data structure of any type. As a non-limiting example, the data structure may be a simple concatenation of the sparse bit arrays. The data structure may include or be otherwise associated with additional information. As an example, information may be included related to how to separate the data array into the sparse bit arrays generated during each round of Steps 204-208. As another example, the data structure may include information indicating what hash function corresponds to each of the sparse bit arrays. Other information may be included in the data structure without departing from the scope of embodiments disclosed herein.

In Step 214, the method includes compressing the data structure generated in Step 212 using lossless compression to obtain a compressed data structure. In one or more embodiments, lossless compression is a form of data compression that uses entropy encoding based on statistical properties of the data being compressed such that the original data is recoverable via a decoding process. As an example, because the data structure includes a set of sparse bit arrays, with many zeros and some number of ones, the data may be highly compressed based at least in part on knowing the quantity and location of the ones within the sparse bit arrays.

In one or more embodiments, once the data structure is compressed in Step 214, the result is a highly compressed data structure that may be distributed to any entity that may test whether an object identifier is in the allowed set, with the answer being deterministic rather than probabilistic.

In one or more embodiments, after the compressed data structure is obtained, the method may proceed to FIG. 3, where the compressed data structure is used to deterministically test allowed set membership.

FIG. 3 illustrates an overview of an example method for using a compressed data structure of sparse bit arrays for testing membership of an object identifier in an allowed set of object identifiers in accordance with one or more embodiments disclosed herein. The method may be performed, for example, by a computing device (e.g., the computing device 100 of FIG. 1, the computing device 500 of FIG. 5).

While the various steps in the flowchart shown in FIG. 3 are presented and described sequentially, some or all of the steps may be executed in different orders, some or all of the steps may be combined or omitted, and/or that or all of the steps may be executed in parallel with other steps of FIG. 2 and/or FIG. 3.

In Step 300, the method includes distributing the compressed data structure obtained in Step 214 of FIG. 2. The compressed data structure may be distributed using any technique for providing data from one entity to another entity. As an example, the compressed data structure may be provided as a token or other form suitable for inclusion in a header used when a request is made to an entity for a service. As an example, the compressed data structure may be generated to correspond to a particular user that has access permissions for a subset of devices of a device ecosystem, with identifiers of such devices being the allowed set corresponding to the user. In one or more embodiments, the token including the compressed data structure may be included in an HTTP header used each time the user makes a request related to devices in the device ecosystem, so that a service to which the request is sent may receive the compressed data structure without having to obtain information from any other source related to which devices the user has permissions for. As another example, any number of micro-services may be implemented within and/or corresponding to a device ecosystem, and the compressed data structure may be provided to all or any portion of such services that may be configured to receive requests from users where allowed set membership testing may be used to determine if the user has appropriate permission to access devices included in the request.

In Step 302, the method includes receiving a request including at least one object identifier. As an example, a request may be made to a micro-service for information about a device in a device ecosystem. The request may be received from a user of the device ecosystem. The request may include an identifier of the device about which information is being requested, such as a UUID. The request may further include the compressed data structure associated with the user.

In Step 304, the method includes decompressing the data structure to obtain the data structure. In one or more embodiments, the compressed data structure may be decompressed using any suitable technique for decompressing compressed data. As an example, when the data structure is compressed using entropy encoding, entropy decoding may be used to decompress the data structure.

In Step 306, the method includes testing allowed set membership using the at least one object identifier, the decompressed data structure, and one or more hash functions. In one or more embodiments, the decompressed data structure includes a set of one or more sparse bit arrays. In one or more embodiments, to test allowed set membership, each object identifier included in the request may be used as input to the hash function(s) that correspond to the sparse bit array(s). As an example, for a first sparse bit array of the set of sparse bit arrays in the decompressed data structure, an object identifier may be used as input to the hash function corresponding to the first sparse bit array to determine if the sparse bit array includes a one at the resulting index position. In one or more embodiments, each object identifier included in the request is tested using the hash functions and corresponding bit arrays to determine if any bit array includes a one at the corresponding index position of the bit array.

In Step 308, the method includes making a determination as to whether the one or more object identifiers are in the allowed set. In one or more embodiments, if the output of any hash function used in Step 306 is an index position that includes a one in the corresponding sparse bit array, then the object identifier is in the allowed set, and the method proceeds to Step 312. In one or more embodiments, if the index positions output by the hash functions for each sparse bit array in the decompressed data structure all include zeros, then the object identifier is in the disallowed set (or at least not in the allowed set), and the method proceeds to Step 310.

In Step 310, the method includes denying the request. The request may be denied in full or in part. As an example, if no object identifier in the request is included in the allowed set, the request may be fully denied, while if only a portion of the object identifiers in the request are not in the allowed set, then the request may be denied as to only those object identifiers. Denying the request may include providing a notice of the denial to the entity that made the request, and/or to any other relevant entity. Denying the request may include logging the attempted request and the denial thereof. Denying the request may include not responding to the request.

In Step 312, the method includes servicing the request. In one or more embodiments, the request may be serviced for any object identifier included in the request that was determined to be in the allowed set. As an example, if a user makes a request to a micro-service to see a certain item of information about three devices identified by the device UUIDs in the request, the service may service the request by providing the requested information to the user.

One of ordinary skill in the art, having the benefit of this disclosure, will appreciate that although the forgoing descriptions include examples of devices as objects, and device identifiers (e.g., UUIDs) as object identifiers, techniques disclosed herein may use any type of objects, and any type of corresponding object identifiers without departing from the scope of embodiments disclosed herein. Additionally, although the forgoing description uses bit arrays initially generated with all zeros, with positions in the bit arrays being set to one in certain ways, any pair of values that are distinguishable from one another may be used without departing from the scope of embodiments disclosed herein. As an example, the bit arrays may be initially generated with all ones, and set to zero at positions that correspond to object identifiers in the allowed set.

Figure 4:
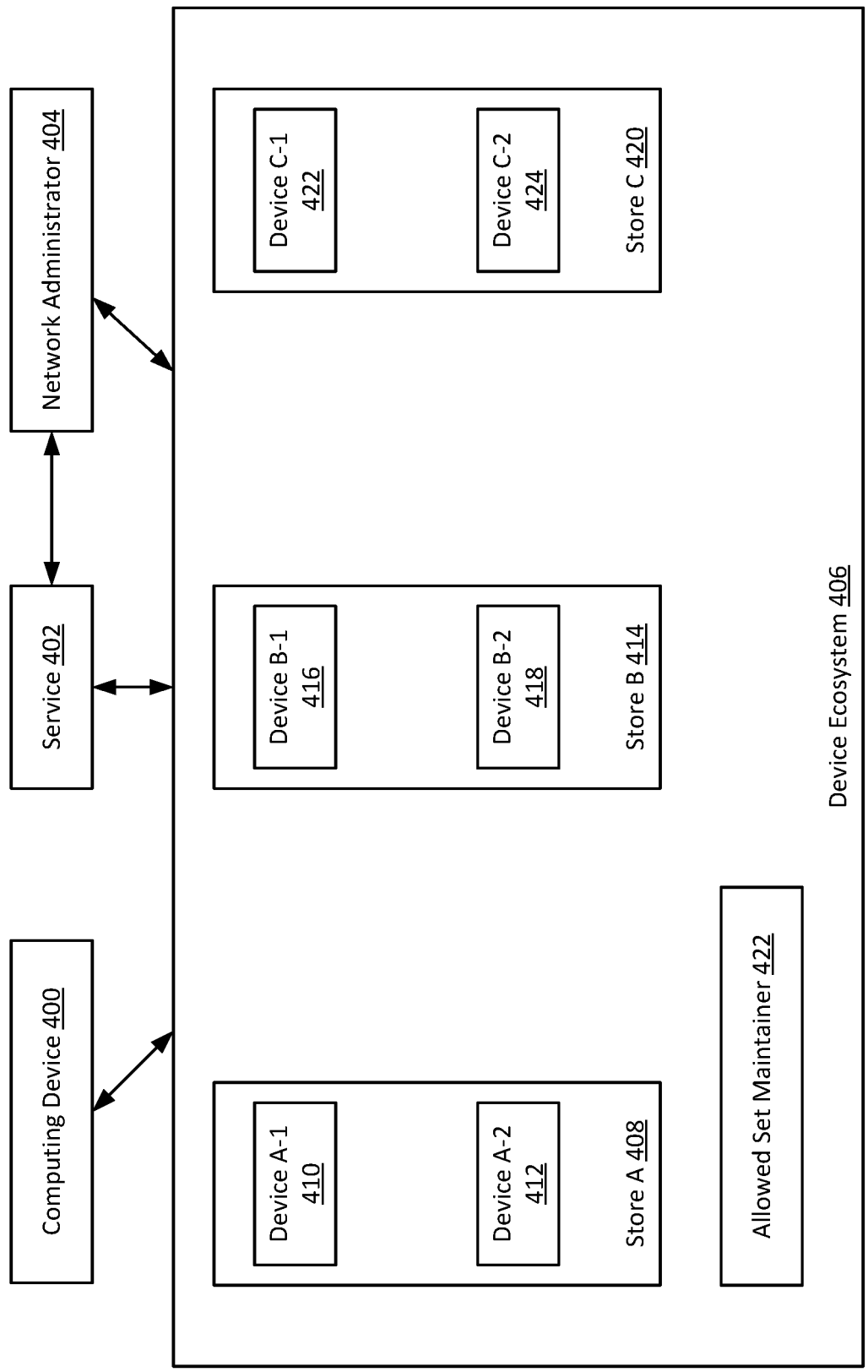
FIG. 4 illustrates an example scenario for testing allowed set membership using a compressed data structure of sparse bit arrays, in accordance with one or more embodiments of this disclosure.

FIG. 4 illustrates an example scenario for testing allowed set membership using a compressed data structure of sparse bit arrays, in accordance with one or more embodiments of this disclosure. The example shown in FIG. 4 and discussed below is a highly simplified example intended for explanatory purposes only, and not intended to limit the scope of embodiments described herein. One of ordinary skill in the art, having the benefit of this disclosure, will appreciate that such a scenario may include many more network administrators or other users, that a device ecosystem may include many more devices (e.g., hundreds, thousands, millions, etc.), and/or that the compressed data structure of sparse bit arrays may be distributed in a manner other than that which is described below. Additionally, while the example shows certain aspects of embodiments described herein, all possible aspects of such embodiments may not be illustrated in this particular example.

Consider a scenario in which a user is a network administrator 404 for a portion of a device ecosystem 406. The device ecosystem 406 is a set of devices for a certain purveyor of retail goods. The purveyor of retail goods has three stores, store A 408, store B 414, and store C 420. Store A includes two network devices, device A-1 410 and device A-2 412. Store B includes two network devices, device B-1 416 and device B-2 418. Store C includes two network devices, device C-1 422 and device C-2 424. The device ecosystem 406 also includes an allowed set maintainer 422, which is a computing device that tracks which devices of the device ecosystem 406 various users, such as the network administrator 404, are allowed to access and about which the users are allowed to obtain information.

In this scenario, the network administrator 404 has been granted permission to receive information about all of the devices in the store A 408, as well as information about device B1 416 of the store B 414. The allowed set maintainer 422 provides the allowed list to the computing device 400 in the form of UUIDs for each of the devices in each of the three stores for which the network administrator 404 is allowed to receive information. The computing device 400, which may be similar to the computing device 100 shown in FIG. 1, performs the method discussed above in the description of FIG. 2 using the set of UUIDs associated with the network administrator 404 to produce a compressed data structure that may be used to test whether the network administrator has access to a given device (e.g., whether a device is in the allowed set corresponding to the user).

Specifically, the computing device 400 uses the allowed set received from the allowed set maintainer 422 and the total set of UUIDs of devices in the device ecosystem 406 to obtain a disallowed set corresponding to the network administrator 404. The computing device 400 generates a bit array of all zeros, and then uses the UUIDs in the allowed set to set to one the value at index positions output by a hash function when the UUIDs of the allowed set are used as input. The computing device then resets to zero any index position in the bit array at which a UUID of a device in the disallowed set causes a hash collision, and adds the allowed devices that correspond to the same position to a new allowed set. The process may go through several rounds, as discussed above in the description of FIG. 2, until a round occurs with no hash collisions. The resulting set of bit arrays is used to create a data structure, which the computing device compresses using a lossless compression technique to obtain the compressed data structure.

The compressed data structure is provided to a device of the network administrator 404 in the form of a token, which will be included in an HTTP header of requests the network administrator 404 makes to receive information about devices in the device ecosystem 406. Such requests may be made by the network administrator 404 to a service 402 that is configured to monitor the performance of devices in the device ecosystem 406.

Continuing the scenario, the network administrator may desire to see page load times of devices. The network administrator 404 may send a request to the service 402. The request may include the token that includes the compressed data structure.

The request may also identify that the network administrator wants to see the desired information for devices in the store A 408 and the store B 414. The service 402 may be configured to translate the stores included in the request to UUIDs of the devices in those stores (e.g., device A-1 410, device A-2 412, device B-1 416, and device B-2 418).

The service 402 may decompress the compressed data structure received as part of the request. The decompressed data structure may then be used to check whether the network administrator is allowed to access the requested information for the four devices. To that end, each of the UUIDs of the devices may be used as input to the hash functions corresponding to each of the sparse bit arrays of the decompressed data structure. The service 402 determines that the UUIDs for device A-1 410, device A-2 412, and device B-1 416, when used as input to one of the hash functions, result in an index position in a sparse bit array that includes a one. The service 402 also determines that the UUID for device B-2 418, when used as input to each of the hash functions corresponding to each of the sparse bit arrays, does not result in an index position in any of the sparse bit arrays with a value of one. Therefore, the service determines that the request may be partially satisfied with the requested information for device A-1 410, device A-2 412, and device B-1 416, but not for device B-2 418. Accordingly, the service 402 provides the requested page load time data for the three devices 410, 412, and 416 to the network administrator 408.

Figure 5:
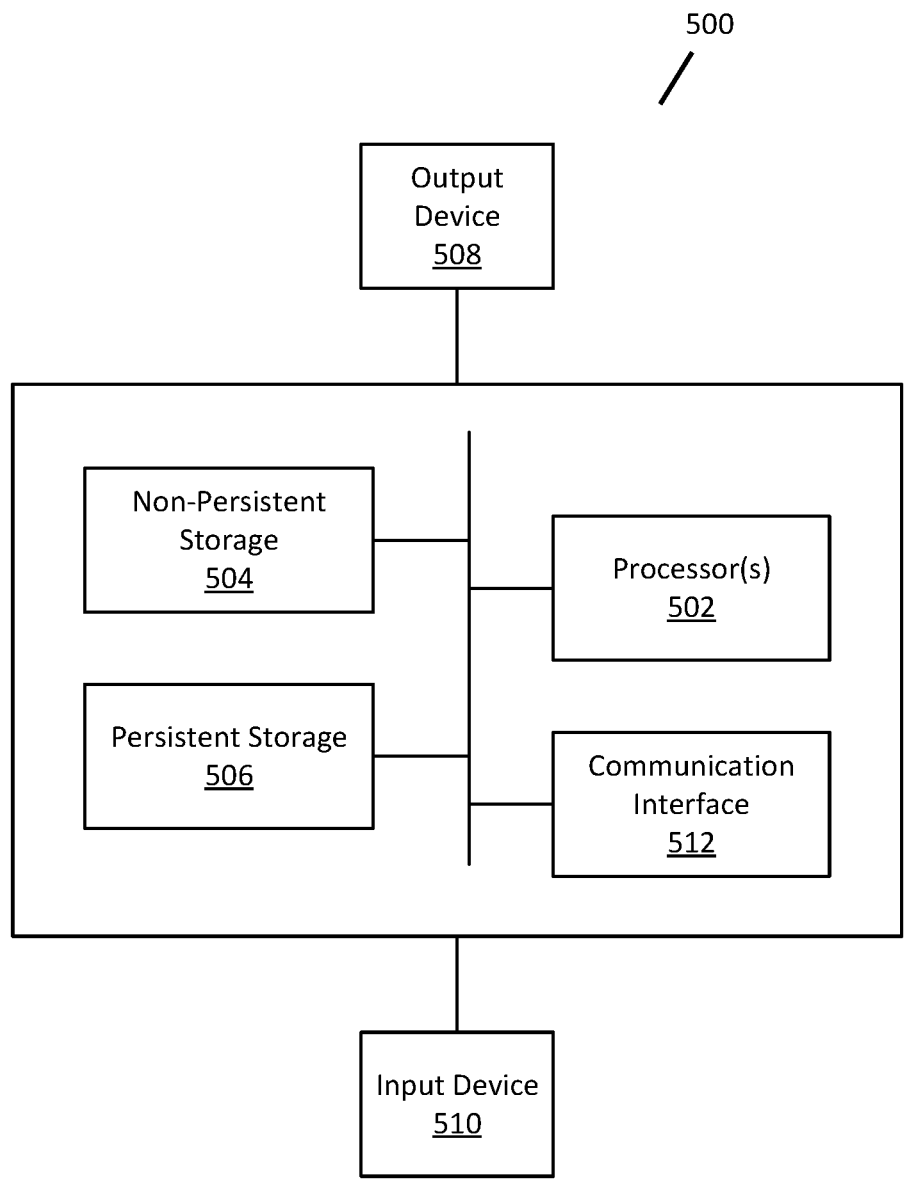
FIG. 5 illustrates a block diagram of a computing device, in accordance with one or more embodiments of this disclosure.

FIG. 5 illustrates a block diagram of a computing device, in accordance with one or more embodiments of this disclosure. As discussed above, embodiments described herein may be implemented using computing devices. For example, all or any portion of the components shown in FIG. 1 may be implemented, at least in part, using one or more computing devices. The computing device 500 may include one or more computer processors 502, non-persistent storage 504 (e.g., volatile memory, such as random access memory (RAM), cache memory, etc.), persistent storage 506 (e.g., a hard disk, an optical drive such as a compact disk (CD) drive or digital versatile disk (DVD) drive, a flash memory, etc.), a communication interface 512 (e.g., Bluetooth interface, infrared interface, network interface, optical interface, etc.), input devices 510, output devices 508, and numerous other elements (not shown) and functionalities. Each of these components is described below.

In one or more embodiments, the computer processor(s) 502 may be an integrated circuit for processing instructions. For example, the computer processor(s) may be one or more cores or micro-cores of a processor. The processor 502 may be a general-purpose processor configured to execute program code included in software executing on the computing device 500. The processor 502 may be a special purpose processor where certain instructions are incorporated into the processor design. Although only one processor 502 is shown in FIG. 5, the computing device 500 may include any number of processors without departing from the scope of embodiments disclosed herein.

The computing device 500 may also include one or more input devices 510, such as a touchscreen, keyboard, mouse, microphone, touchpad, electronic pen, motion sensor, or any other type of input device. The input devices 510 may allow a user to interact with the computing device 500. In one or more embodiments, the computing device 500 may include one or more output devices 508, such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) 502, non-persistent storage 504, and persistent storage 506. Many different types of computing devices exist, and the aforementioned input and output device(s) may take other forms. In some instances, multimodal systems can allow a user to provide multiple types of input/output to communicate with the computing device 500.

Further, the communication interface 512 may facilitate connecting the computing device 500 to a network (not shown) (e.g., a local area network (LAN), a wide area network (WAN) such as the Internet, mobile network, or any other type of network) and/or to another device, such as another computing device. The communication interface 512 may perform or facilitate receipt and/or transmission wired or wireless communications using wired and/or wireless transceivers, including those making use of an audio jack/plug, a microphone jack/plug, a universal serial bus (USB) port/plug, an Apple® Lightning® port/plug, an Ethernet port/plug, a fiber optic port/plug, a proprietary wired port/plug, a Bluetooth® wireless signal transfer, a BLE wireless signal transfer, an IBEACON® wireless signal transfer, an RFID wireless signal transfer, near-field communications (NFC) wireless signal transfer, dedicated short range communication (DSRC) wireless signal transfer, 802.11 WiFi wireless signal transfer, WLAN signal transfer, Visible Light Communication (VLC), Worldwide Interoperability for Microwave Access (WiMAX), IR communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer, ultraviolet light signal transfer, wireless signal transfer along the electromagnetic spectrum, or some combination thereof. The communications interface 512 may also include one or more Global Navigation Satellite System (GNSS) receivers or transceivers that are used to determine a location of the computing device 500 based on receipt of one or more signals from one or more satellites associated with one or more GNSS systems. GNSS systems include, but are not limited to, the US-based GPS, the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

The term computer-readable medium includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as CD or DVD, flash memory, memory, or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

All or any portion of the components of the computing device 500 may be implemented in circuitry. For example, the components can include and/or can be implemented using electronic circuits or other electronic hardware, which can include one or more programmable electronic circuits (e.g., microprocessors, GPUs, DSPs, CPUs, and/or other suitable electronic circuits), and/or can include and/or be implemented using computer software, firmware, or any combination thereof, to perform the various operations described herein. In some aspects the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

In the above description, numerous details are set forth as examples of embodiments described herein. It will be understood by those skilled in the art (who also have the benefit of this Detailed Description) that one or more embodiments described herein may be practiced without these specific details, and that numerous variations or modifications may be possible without departing from the scope of the embodiments described herein. Certain details known to those of ordinary skill in the art may be omitted to avoid obscuring the description.

Specific details are provided in the description above to provide a thorough understanding of the aspects and examples provided herein. However, it will be understood by one of ordinary skill in the art that the aspects may be practiced without these specific details. For clarity of explanation, in some instances the present technology may be presented as including functional blocks that may include devices, device components, steps or routines in a method embodied in software, or combinations of hardware and software. Additional components may be used other than those shown in the figures and/or described herein. For example, circuits, systems, networks, processes, and other components may be shown as components in block diagram form in order not to obscure the aspects in unnecessary detail. In other instances, well-known circuits, processes, algorithms, structures, and techniques may be shown without unnecessary detail in order to avoid obscuring the aspects.

Individual aspects may be described above as a process or method which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed but may have additional steps not included in a figure. A process may correspond to a method, a function, a procedure, a subroutine, a subprogram, etc. When a process corresponds to a function, its termination can correspond to a return of the function to the calling function or the main function.

Processes and methods according to the above-described examples can be implemented using computer-executable instructions that are stored or otherwise available from computer-readable media. Such instructions can include, for example, instructions and data which cause or otherwise configure a general-purpose computer, special purpose computer, or a processing device to perform a certain function or group of functions. Portions of computer resources used can be accessible over a network. The computer executable instructions may be, for example, binaries, intermediate format instructions such as assembly language, firmware, source code, etc. Examples of computer-readable media that may be used to store instructions, information used, and/or information created during methods according to described examples include magnetic or optical disks, flash memory, USB devices provided with non-volatile memory, networked storage devices, and so on.

In the above description of the figures, any component described with regard to a figure, in various embodiments described herein, may be equivalent to one or more same or similarly named and/or numbered components described with regard to any other figure. For brevity, descriptions of these components may not be repeated with regard to each figure. Thus, each and every embodiment of the components of each figure is incorporated by reference and assumed to be optionally present within every other figure having one or more same or similarly named and/or numbered components. Additionally, in accordance with various embodiments described herein, any description of the components of a figure is to be interpreted as an optional embodiment, which may be implemented in addition to, in conjunction with, or in place of the embodiments described with regard to a corresponding one or more same or similarly named and/or numbered component in any other figure.

Throughout the application, ordinal numbers (e.g., first, second, third, etc.) may be used as an adjective for an element (i.e., any noun in the application). The use of ordinal numbers is not to imply or create any particular ordering of the elements, nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information may travel may be considered an operative connection.

While embodiments discussed herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A device, comprising:
one or more processors; and
one or more non-transitory computer readable media storing instructions which, when executed by the one or more processors, cause the one or more processors to:
obtain an allowed set comprising a first plurality of identifiers corresponding to a plurality of objects;
obtain, according to the allowed set and a total set of identifiers, a disallowed set comprising a second plurality of identifiers;
generate an initial bit array comprising a first value at each position of a plurality of positions in the initial bit array;
obtain a first set of index values corresponding to a subset of positions of the plurality of positions using the first plurality of identifiers and a first hash function of a plurality of hash functions;
set each of the subset of positions in the initial bit array to a second value to obtain an updated initial bit array;
perform a first collision check using the first hash function, the disallowed set, and the updated initial bit array to obtain a first bit array and a new allowed set comprising a subset of the identifiers of the allowed set;
obtain a new set of index values using the new allowed set and a new hash function of the plurality of hash functions;
set, using the new set of index values, a new subset of positions of a new initial bit array to the second value;
perform a second collision check using the disallowed set, the new hash function, and the new initial bit array to obtain a second bit array;
generate, when the second collision check results in no collisions, a data structure comprising the first bit array; and
compress the data structure to obtain a compressed data structure.

2. The device of claim 1, wherein each identifier in the first plurality of identifiers and the second plurality of identifiers are separate device identifiers corresponding to a plurality of devices of a device ecosystem.

3. The device of claim 1, wherein the compressed data structure is compressed using a lossless compression technique.

4. The device of claim 1, wherein the instructions, when executed by the one or more processors, further cause the one or more processors to:
perform a plurality of rounds of sparse bit array generation after performing the first collision check and before performing the second collision check.

5. The device of claim 1, wherein the compressed data structure is distributed for testing membership in the allowed set in response to a request that includes an identifier of an object.

6. The device of claim 5, wherein the compressed data structure is distributed to a user for inclusion in the request.

7. The device of claim 1, wherein the instructions, when executed by the one or more processors, further cause the one or more processors to:
select the plurality of hash functions based at least in part on each of the plurality of hash functions outputting values corresponding to index positions of the first bit array.

8. A computer-implemented method, comprising:
obtaining, by a processing device, an allowed set comprising a first plurality of identifiers corresponding to a plurality of objects;
obtaining, by the processing device and according to the allowed set and a total set of identifiers, a disallowed set comprising a second plurality of identifiers;
generating, by the processing device, an initial bit array comprising a first value at each position of a plurality of positions in the initial bit array;
obtaining a first set of index values corresponding to a subset of positions of the plurality of positions using the first plurality of identifiers and a first hash function of a plurality of hash functions;
setting each of the subset of positions in the initial bit array to a second value to obtain an updated initial bit array;
performing a first collision check using the first hash function, the disallowed set, and the updated initial bit array to obtain a first bit array and a new allowed set comprising a subset of the identifiers of the allowed set;
obtaining a new set of index values using the new allowed set and a new hash function of the plurality of hash functions;
setting, using the new set of index values, a new subset of positions of a new initial bit array to the second value;
performing a second collision check using the disallowed set, the new hash function, and the new initial bit array to obtain a second bit array;
generating, when the second collision check results in no collisions, a data structure comprising the first bit array; and
compressing the data structure to obtain a compressed data structure.

9. The computer-implemented method of claim 8, wherein each identifier in the first plurality of identifiers and the second plurality of identifiers are separate device identifiers corresponding to a plurality of devices of a device ecosystem.

10. The computer-implemented method of claim 8, wherein the compressed data structure is compressed using a lossless compression technique.

11. The computer-implemented method of claim 8, further comprising:
performing a plurality of rounds of sparse bit array generation after performing the first collision check and before performing the second collision check.

12. The computer-implemented method of claim 8, wherein the compressed data structure is distributed for testing membership in the allowed set in response to a request that includes an identifier of an object.

13. The computer-implemented method of claim 12, wherein the compressed data structure is distributed to a user for inclusion in the request.

14. The computer-implemented method of claim 8, further comprising:
selecting the plurality of hash functions based at least in part on each of the plurality of hash functions outputting values corresponding to index positions of the first bit array.

15. A non-transitory computer-readable medium storing programming for execution by one or more processors, the programming comprising instructions to:
obtain an allowed set comprising a first plurality of identifiers corresponding to a plurality of objects;
obtain, according to the allowed set and a total set of identifiers, a disallowed set comprising a second plurality of identifiers;

generate an initial bit array comprising a first value at each position of a plurality of positions in the initial bit array;

obtain a first set of index values corresponding to a subset of positions of the plurality of positions using the first plurality of identifiers and a first hash function of a plurality of hash functions;

set each of the subset of positions in the initial bit array to a second value to obtain an updated initial bit array;

perform a first collision check using the first hash function, the disallowed set, and the updated initial bit array to obtain a first bit array and a new allowed set comprising a subset of the identifiers of the allowed set;

obtain a new set of index values using the new allowed set and a new hash function of the plurality of hash functions;

set, using the new set of index values, a new subset of positions of a new initial bit array to the second value;

perform a second collision check using the disallowed set, the new hash function, and the new initial bit array to obtain a second bit array;

generate, when the second collision check results in no collisions, a data structure comprising the first bit array; and compress the data structure to obtain a compressed data structure.

16. The non-transitory computer-readable medium of claim 15, wherein each identifier in the first plurality of identifiers and the second plurality of identifiers are separate device identifiers corresponding to a plurality of devices of a device ecosystem.

17. The non-transitory computer-readable medium of claim 15, wherein the compressed data structure is compressed using a lossless compression technique.

18. The non-transitory computer-readable medium of claim 15, wherein the programming comprises further instructions to:

perform a plurality of rounds of sparse bit array generation after performing the first collision check and before performing the second collision check.

19. The non-transitory computer-readable medium of claim 15, wherein the compressed data structure is distributed for testing membership in the allowed set in response to a request that includes an identifier of an object.

20. The non-transitory computer-readable medium of claim 19, wherein the compressed data structure is distributed to a user for inclusion in the request.

* * * * *